(12) United States Patent
Favre et al.

(10) Patent No.: US 10,847,494 B2
(45) Date of Patent: Nov. 24, 2020

(54) METHOD OF DETERMINING THERMAL IMPEDANCE OF A SINTERING LAYER AND A MEASUREMENT SYSTEM

(71) Applicants: Agile Power Switch 3D-Integration aPSI3D, Tarbes (FR); IRT Saint Exupery (AESE), Toulouse (FR); Ecole Nationale D'Ingenieurs de Tarbes, Tarbes (FR)

(72) Inventors: Jacques Pierre Henri Favre, Toulouse (FR); Jean-Michel Francis Reynes, Gaillac (FR); Raphaël Riva, Ger (FR); Paul-Etienne Joseph Vidal, Tarbes (FR); Baptiste Louis Jean Trajin, Auzas (FR)

(73) Assignees: AGILE POWER SWITCH 3D-INTEGRATION APSI3D, Tarbes (FR); IRT SAINT EXUPERY (AESE), Toulouse (FR); ECOLE NATIONALE D'INGENIEURS DE TARBES, Tarbes (FR)

( * ) Notice: Subject to any disclaimer, the term of this patent is extended or adjusted under 35 U.S.C. 154(b) by 0 days.

(21) Appl. No.: 16/339,092

(22) PCT Filed: Oct. 2, 2017

(86) PCT No.: PCT/EP2017/075008
§ 371 (c)(1),
(2) Date: Apr. 3, 2019

(87) PCT Pub. No.: WO2018/065379
PCT Pub. Date: Apr. 12, 2018

(65) Prior Publication Data
US 2020/0043885 A1     Feb. 6, 2020

(30) Foreign Application Priority Data

Oct. 6, 2016    (EP) ..................................... 16306318

(51) Int. Cl.
*H01L 23/00*      (2006.01)
*H01L 21/66*      (2006.01)

(52) U.S. Cl.
CPC .............. *H01L 24/83* (2013.01); *H01L 22/12* (2013.01); *H01L 24/75* (2013.01);
(Continued)

(58) Field of Classification Search
CPC ......... H01L 24/83; H01L 24/75; H01L 22/12; H01L 2224/83908; H01L 2224/8384;
(Continued)

(56) References Cited

U.S. PATENT DOCUMENTS 3,253,221 A     5/1966   Peckover
4,216,017 A     8/1980   Carcey
(Continued)

FOREIGN PATENT DOCUMENTS

| CN | 101452818 A | 6/2009 |
|---|---|---|
| EP | 1772900 A2 | 4/2007 |
| WO | 2008145930 A2 | 12/2008 |

OTHER PUBLICATIONS

Zheng, H., et al., "Thermal characterizaton system for transient thermal impedance measurement and power cycling of IGBT modules," Microelectronics and Reliability 2015;55(12):2575-2581.
(Continued)

*Primary Examiner* — Ahmed N Sefer
(74) *Attorney, Agent, or Firm* — Kenealy Vaidya LLP

(57) ABSTRACT

Some embodiments are directed to a method of determining a sintering thermal impedance of a sintering layer by: providing a substrate having a predetermined substrate thermal impedance and disposing the sintering layer on the substrate forming with the sintering layer a stack. Placing at least one semiconductor die, that includes a semiconductor element with at least two element electrodes on the sintering
(Continued)

layer. Injecting an electrical current through the at least two element electrodes for measuring a temperature sensitive parameter of the semiconductor element. Heating the stack with a predetermined heat power and determining, while sintering, a semiconductor element temperature from the measured temperature sensitive parameter. Measuring a stack temperature and determining a stack thermal impedance by subtracting the semiconductor element temperature from the stack temperature and dividing by the predetermined heat power, and subtracting the predetermined substrate thermal impedance from the stack thermal impedance.

13 Claims, 3 Drawing Sheets

(52) U.S. Cl.
CPC .. *H01L 2224/753* (2013.01); *H01L 2224/759* (2013.01); *H01L 2224/8384* (2013.01); *H01L 2224/83203* (2013.01); *H01L 2224/83908* (2013.01)

(58) Field of Classification Search
CPC ..... H01L 2224/83203; H01L 2224/759; H01L 2224/753; H01L 24/29; H01L 24/32; H01L 2224/83192; H01L 2224/32225; H01L 2224/32145; G01N 27/02
See application file for complete search history.

(56) References Cited

U.S. PATENT DOCUMENTS

| | | | |
|---|---|---|---|
| 5,795,063 A * | 8/1998 | Christiaens | G01N 25/18 374/43 |
| 2007/0202616 A1* | 8/2007 | Russell | G01R 31/2896 438/15 |
| 2011/0156094 A1 | 6/2011 | Haederli et al. | |
| 2013/0020694 A1 | 1/2013 | Liang et al. | |
| 2014/0224409 A1 | 8/2014 | Hauenstein | |

OTHER PUBLICATIONS

Yunhui, M., et al., "Transient Thermal Impedance Measurement on Low-Temperature-Sintered Nanoscale Silver Joints," Journal of Electronic Materials 2012;41(11):3152-3160.

Xiao, C., et al., "Characterization of Lead-Free Solder and Sintered Nano-Silver Die-Attach Layers Using Thermal Impedance," IEEE Transactions on Components, Packaging and Manufacturing Technology, IEEE, USA, Apr. 1, 2011, vol. 1, No. 4, pp. 495-501.

International Search Report and Written Opinion for PCT Patent App. No. PCT/EP2017/075008 (dated Jan. 2, 2018).

JEDEC JC-15 Committee on Thermal Characterization, "Transient Dual Interface Test Method for the Measurement of the Thermal Resistance Junction-to-Case of Semiconductor Devices with Heat Flow Through a Single Path," JEDEC Solid State Technology Association, JEDEC Standard No. 51-14, Nov. 2010, 46 pages, Arlington, VA.

Yvan Avenas, et al., "Temperature Measurement of Power Semiconductor Devices by Thermo-Sensitive Electrical Parameters—A Review," IEEE Transactions on Power Electronics, vol. 27, No. 6, Jun. 2012, pp. 3081-3092.

* cited by examiner

METHOD OF DETERMINING THERMAL IMPEDANCE OF A SINTERING LAYER AND A MEASUREMENT SYSTEM

CROSS REFERENCE TO RELATED APPLICATIONS

This application is a national phase filing under 35 C.F.R. § 371 of and claims priority to PCT Patent Application No. PCT/EP2017/075008, filed on Feb. 10, 2017, which claims the priority benefit under 35 U.S.C. § 119 of European Patent Application No. 16306318.3, filed on Oct. 6, 2016, the contents of each of which are hereby incorporated in their entireties by reference.

BACKGROUND

Some embodiments relate to a method of determining the thermal impedance of a sintering layer and a measurement system.

Integrated electronic devices include different types of semiconductor elements such as transistors, diodes as well as resistors, capacitors and inductors. These semiconductor elements are integrated in semiconductor dice which are commonly mounted on a substrate. The substrate can be used as an electrical interface to other semiconductor elements. The substrate can for example be used to electrically connect the semiconductor elements to external power supplies and signal generators. Further, the substrate can be used as a mechanical interface for the semiconductor die such that the semiconductor die can be handled more easily.

The semiconductor dice can be soldered on the substrate by placing a solder paste at the interface between the substrate and the semiconductor die and by heating the solder paste until a melting point of the solder paste is achieved. After cooling the solder paste, a joint is formed between the semiconductor die and the substrate.

Alternatively, a sintering layer may be placed at the interface between the substrate and the semiconductor die. The sintering layer may include a mixture of conductive powder, for example silver powder and a solvent. By heating the sintering layer, the solvent is removed from the mixture so as to cause the solvent to evaporate.

Thereafter, the sintering layer is disposed on the substrate and the semiconductor die is placed on the sintering layer. The semiconductor die, the sintering layer and the substrate are heated. Optionally a compression force may be applied on the semiconductor die.

The combined action of duration of the heating and application of the compression force causes the sintering layer to sinter and to bond the semiconductor die to the substrate.

Would the sintering process fail to provide sufficient bonding between the semiconductor die and the substrate, this could lead to bad electrical or mechanical contacts with the substrate, reducing the electrical or mechanical yield of such integrated electronic devices. The semiconductor die may even be torn away from the desired location while assembling or handling the integrated electronic device.

Sometimes there are requirements on the maximum allowed heat and compression forces applicable to the semiconductor die which cannot be exceeded.

Hence, in order to maintain the assembly yield to acceptable levels and to control heat and compression force required for sintering, there is a need to monitor the quality of the sintering joint between the substrate and the semiconductor die.

In document US2010/0176098, there is a measurement method and a measurement means described to monitor the temperature of a chip bonded via a sintering mass to a support. A laser beam irradiates the support and sinters the sintering mass. The measurement means includes an optical fiber that collects infrared flux emitted by the chip and conveys it to a pyrometer. The pyrometer converts the collected light flux into a temperature value. This temperature value is used to control the sintering process by heating the sintering mass to the desired temperature.

However, the method described in US2010/0176098 determines a surface temperature of the chip which is different from the temperature of the sintering mass, at least until the stack formed by the support, sintering mass and chip has reached the thermal equilibrium.

Thus there is a need for a method of determining the temperature of the sintering mass.

SUMMARY

A drawback of existing methods of determining the temperature of a sintering layer during a sintering process is that they are based on optical systems. Optical systems, like infrared cameras, can only measure surface temperature of objects towards which the cameras are pointed out. Hence, if a chip is bonded onto a support via a sintering layer and the infrared camera is pointed towards the chip, the camera will measure a surface temperature of the chip and not that of the sintering layer.

One of the aspects of the presently disclosed subject matter is to determine the thermal behavior of the sintering layer such that quality of the sintering process can be better monitored. Embodiments are defined in the dependent claims.

A first aspect of the presently disclosed subject matter provides a method of determining a sintering thermal impedance of a sintering layer. The method includes:

providing a substrate having a predetermined substrate thermal impedance, disposing the sintering layer on the substrate The substrate and the sintering layer form a stack.

placing at least one semiconductor die on the sintering layer, the semiconductor die including a semiconductor element including at least two element electrodes, injecting an electrical current through the at least two element electrodes for measuring a temperature sensitive parameter of the semiconductor element, heating the stack for sintering the sintering layer with a predetermined heat power, determining, while sintering, a semiconductor element temperature from the measured temperature sensitive parameter, measuring a stack temperature, determining a stack thermal impedance by subtracting the semiconductor element temperature from the stack temperature to obtain a temperature difference, and dividing the temperature difference by the predetermined heat power, determining the sintering thermal impedance by subtracting the predetermined substrate thermal impedance to the stack thermal impedance.

By knowing the predetermined thermal impedance of the substrate, determining the temperature of the semiconductor element via its temperature sensitive parameter, and measuring the temperature of the stack formed by the substrate and the sintering layer, the thermal impedance of the sintering layer can be determined at a location corresponding to the location of the semiconductor element.

Further, the thermal impedance of the sintering layer can be determined while sintering is occurring.

The inventive method allows real-time monitoring of the evolution of the thermal impedance of the sintering layer while a thermal conductivity of the sintering layer increases while sintering is occurring. This effect cannot be reached by conventional art optical methods measuring only surface temperatures.

In an embodiment, stack heating is stopped when the determined sintering thermal impedance has reached a predetermined value.

For example, assembly of the semiconductor die may be performed in two or more phases: during a first phase, a pre-sintering process may be started in which the semiconductor die is bonded to the substrate by sintering until the sintering thermal impedance has reached a predetermined value. The predetermined value of the sintering thermal impedance may correspond to a value for which the semiconductor die is bonded to the substrate with a first predetermined shear and/or pull strength. The first predetermined shear and/or pull strength may be sufficient to allow the stack and the semiconductor element to be handled in further assembly phases without that the semiconductor die is displaced from its desired position.

The predetermined value of the sintering thermal impedance may be 0.05° C./watts or lower for a semiconductor die as large as 1 cm$^2$.

Stopping the stack heating as soon as the sintering thermal impedance has reached the predetermined value prevents thermal overstress of the substrate and semiconductor element and improves yield of the assembly.

During a second phase, a full sintering process can be performed by for example further heating of the stack. Further heating of the stack may be performed in an oven or furnace. Further heating of the stack may be performed for obtaining a sintering thermal impedance value corresponding to a second predetermined shear and/or pull strength of the semiconductor die. The second predetermined shear and/or pull strength may be higher than the first predetermined shear and/or pull strength. The second predetermined shear and/or pull strength may ensure that assembly of the stack and semiconductor die satisfies the mechanical requirements for final assembly production.

In an embodiment the substrate is at least partially conductive and includes a substrate electrode. Injecting the electrical current is performed via the substrate electrode by electrically connecting one of the element electrodes to the substrate via the sintering layer.

For example, one of the element electrode may be arranged at a top side of the semiconductor die and the other element electrode may be arranged at the back side of the semiconductor die. For example, the element electrode arranged at the top side may be connected to a positive terminal of a power supply and the element electrode arranged at the back side of the semiconductor die may be connected to a reference potential, e.g. the ground.

This arrangement is particularly suitable for vertically integrated semiconductor elements. Vertically integrated semiconductor elements are commonly used in power switching applications. However, the method is not limited to determine the sintering thermal impedance of bonded vertically integrated semiconductor elements. Horizontally integrated semiconductor elements may be used in which case both element electrodes may be arranged at the top of the semiconductor die.

The semiconductor element may be a transistor, a Field Effect Transistor (FET), a Metal Oxide Semiconductor Field Effect Transistor (MOSFET), a thyristor, an insulated-gate bipolar transistor (IGBT), a diode or another appropriate switching or non-switching semiconductor element integrated in the semiconductor die.

For a diode, the temperature sensitive parameter may be a forward direct voltage of the diode. The relationship of the forward direct voltage of a diode versus the temperature is well known. The forward direct voltage of a diode decreases 2 mV per degree Celsius (or Kelvin).

For an IGBT, the corresponding temperature sensitive parameter may be a collector emitter saturation voltage. For a MOSFET, the corresponding temperature sensitive parameter may be a drain-source on-voltage, or a threshold voltage.

In one embodiment, while heating the stack, a compression force is applied on the semiconductor die against the substrate.

The compression force has a vertical direction and maintains the semiconductor die in place on the sintering layer against the substrate.

Predetermined heat power and a value of the compression force are controlled according to the desired sintering requirements.

In an embodiment, the stack temperature may be measured by measuring a substrate temperature at a front side of the substrate where the sintering is disposed.

In an embodiment, the stack temperature may be measured by measuring a substrate temperature at a back side of the substrate opposite to the front side of the substrate where the sintering layer is disposed.

In an embodiment, measuring the stack temperature includes using a thermocouple having a sensing temperature electrode thermally coupled to the substrate.

In an embodiment, the method further includes placing a further semiconductor die on the sintering layer. The further semiconductor die includes a further semiconductor element including at least two corresponding further element electrodes for injecting a current therein and measuring a corresponding further temperature sensitive parameter of the further semiconductor element.

According to this embodiment a further semiconductor element temperature can be determined from the further temperature sensitive parameter. The thermal impedance of the stack can be determined by subtracting the further semiconductor element temperature from the stack temperature to obtain a further temperature difference and dividing the further temperature difference by the predetermined heat power. Finally the sintering thermal impedance of the sintering layer at a location corresponding to the further semiconductor element can be determined by subtracting the predetermined substrate thermal impedance from the stack thermal impedance.

A further aspect of the presently disclosed subject matter provides a measurement system for determining a sintering thermal impedance of a sintering layer. The sintering layer is disposed on a substrate for bonding a semiconductor die to the substrate. The semiconductor die includes a semiconductor element. The sintering layer and the substrate form a stack. The substrate has a predetermined substrate thermal impedance. The semiconductor element includes at least two element electrodes.

The measurement system includes a current source for injecting an electrical current through at least two element electrodes for measuring a temperature sensitive parameter of the semiconductor element, a heat source for heating the stack for sintering the sintering layer with a predetermined heat power, a first measurement device configured to determine a semiconductor element temperature from the temperature sensitive parameter, a second measurement device configured to measure a stack temperature, and a processing device configured to determine a stack thermal impedance by subtracting the semiconductor element temperature from the stack temperature to obtain a temperature difference and dividing the temperature difference by the predetermined heat power and determine the sintering thermal impedance by subtracting the predetermined substrate thermal impedance from the stack thermal impedance.

The measurement system is suitable to determine a sintering thermal impedance of the sintering layer. The measurement system may be used in assembly production of the semiconductor die such that the semiconductor die is bonded by sintering to the substrate with sufficient strength allowing safe handling of the bonded semiconductor die.

BRIEF DESCRIPTION OF THE DRAWINGS

These and other aspects of the presently disclosed subject matter are apparent from and will be elucidated with reference to the embodiments described hereinafter. In the drawings, FIG. 1 schematically shows a flow diagram of a method of determining a sintering thermal impedance of a sintering layer, FIG. 2 schematically shows a substrate, FIG. 3 schematically shows a sintering layer on top of a substrate, FIG. 4 schematically shows a semiconductor die placed on a substrate with a sintering layer via a pick and place tool, FIG. 5 schematically shows a measurement system for determining a sintering thermal impedance of a sintering layer according to an embodiment, FIG. 6 schematically shows a measurement system for determining a sintering thermal impedance of a sintering layer according to another embodiment.

It should be noted that items which have the same reference numbers in different figures, have the same structural features and the same functions, or are the same signals. Where the function and/or structure of such an item has been explained, there is no necessity for repeated explanation thereof in the detailed description.

DETAILED DESCRIPTION OF EXEMPLARY EMBODIMENTS

Figure 1:
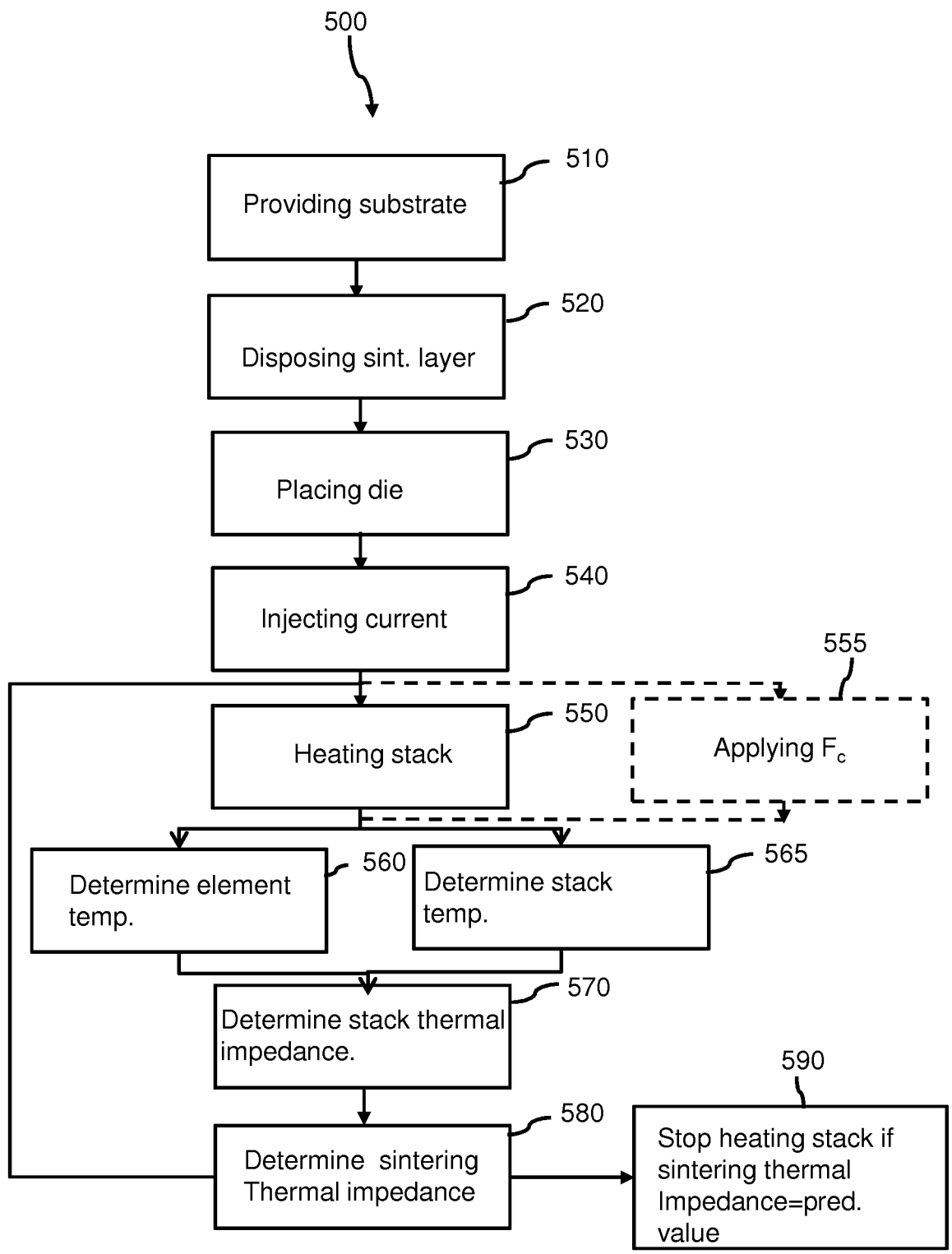

FIG. 1 schematically shows a flow diagram 500 of a method of determining a sintering thermal impedance of a sintering layer.

FIGS. 2 to 5 schematically show step by step of an embodiment of the method.

The method will be hereinafter described with reference to the flow diagram 500 and the FIGS. 2 to 5.

Figure 2:

In FIG. 2 a substrate 20 is provided. Providing the substrate 510 is the first step of the flow diagram 500 shown in FIG. 1. The substrate 20 has a predetermined substrate thermal impedance. The thermal impedance may be for example known from the manufacturer of the substrate 20.

Thermal impedance is defined as a ratio of the time function of a temperature difference divided by applied heat power and is measured in Kelvin per Watt [K/W]. The static value of the thermal impedance is the thermal resistance. Thermal resistance may be used to calculate true constant quantities, as well as average temperatures of periodic functions.

The substrate 20 may be manufactured of multiple layers of thermally conductive, electrically insulating materials (e.g. ceramics), and highly electrically conductive materials (e.g. metals such as copper or aluminium). In the example shown in FIG. 2, the substrate 20 includes three layers, two high electrically conductive layers 5 and 10 sandwiched between a thermally conductive, electrically insulating layer of ceramic 15. Examples of ceramics include, but are not limited to Aluminium Nitride (AlN), Aluminium Oxide ($Al_2O_3$), and Silicon Nitride ($Si_3N_4$). Another example of ceramic material is $Si_3N_4$.

Typically, in the relevant field, such substrates are termed as Direct Bonded Copper (DBC) substrates, or Active Metal Bonding/Brazing (AMB) substrates. Moreover, suitable substrates are described in a paper "Comparison of Silicon Nitride DBC and AMB Substrates for different applications in power electronics" of Manfred Goetz et al, pp 57-65, PCIM Europe conference, Nuremberg, 14-16 May 2013, published by VDE Verlag, Berlin. The article of Goetz et al is incorporated as a reference.

The substrate 20 may further include other electronic elements including elements made up of a semiconductor material, such as, but not limited to silicon, silicon carbide, gallium arsenide, gallium nitride, diamond based semiconductor material, or other appropriate semiconductor materials. Examples of other appropriate semiconductor materials include, but not limited to resistors, capacitors, inductors, sensors, integrated circuits (for example, a driving circuitry), or other appropriate electronic elements.

Figure 3:
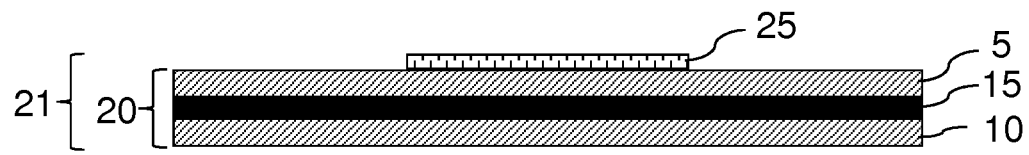

In FIG. 3 a sintering layer 25 is disposed on the substrate 20. This corresponds to method step 520 in flow diagram 500. The sintering layer 25 and the substrate form together a stack 21 of layers.

The sintering layer may include a mixture of conductive powder, for example silver powder and a solvent. By heating the sintering layer, the solvent is removed from the mixture so as to cause the solvent to evaporate. Other metallic powders than silver powder may be used: for example gold, tungsten, or the like.

The sintering layer 25 may be made of electrically conductive material and/or thermally conductive material.

Figure 4:
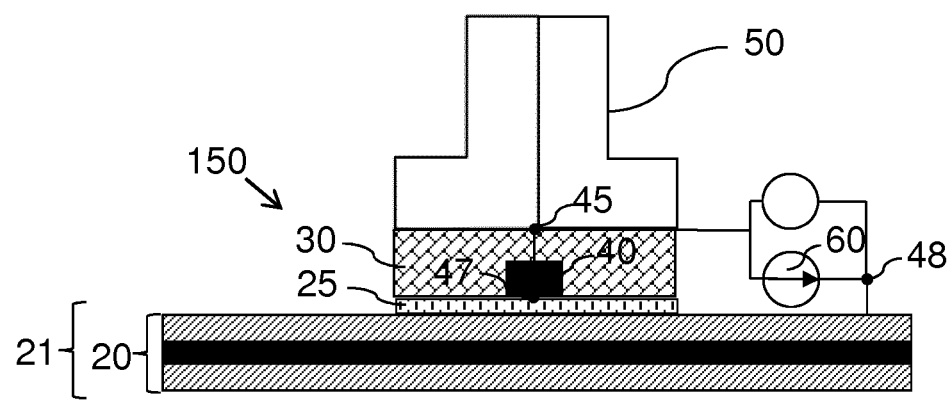

In FIG. 4 a semiconductor die 30 including a semiconductor element 40 is placed on the sintering layer 25. This corresponds to method step 530 in flow diagram 500. The semiconductor element 40 includes at least two device electrodes 45 and 47. The semiconductor element 40 may be integrated in the semiconductor die 30.

The semiconductor die 30 may be placed on the substrate by a pick and place tool 50 for picking the semiconductor die 30 and placing it on the substrate 20 at the desired location.

The semiconductor element 40 may be a transistor, a Field Effect Transistor (FET), a Metal Oxide Semiconductor Field Effect Transistor (MOSFET), a thyristor, an insulated-gate bipolar transistor (IGBT), a diode or another appropriate switching or non-switching semiconductor element.

When the switching semiconductor element 40 is a transistor, the switching semiconductor element 40 may include a wide band gap semiconductor material. Optionally, the wide band gap semiconductor material includes, but not limited to silicon carbide (SiC), gallium nitride (GaN) or diamond.

The semiconductor die 30, which is bonded to the substrate 20 by sintering, forms an integrated circuit device 150.

The integrated circuit device 150 may include additional components which may be assembled on the same substrate 20.

The pick and place tool 50 may include a suction duct (not shown) connected to suction means, for example including a vacuum pump (not shown). By enabling the vacuum pump, pick and place tool 50 may suction the semiconductor die 30 from a first die side opposite to a second die side placed in contact with the sintering layer 25. Pick and place tool 50 may further include a moving mechanical means (not shown) to pick the semiconductor die 30 up from one location, for example a semiconductor wafer containing many semiconductor dice, and placing the semiconductor die 30 to the desired location on the substrate 20. The mechanical means may be manually controlled or automatically, e.g. electrically, controlled.

An electrical current is injected by current source 60 through the at least two element electrodes 45 and 47 for measuring a temperature sensitive parameter of the semiconductor element 40. This corresponds to method step 540 in flow diagram 500.

In one embodiment, shown in FIG. 4, the substrate 20 has a substrate electrode 48. One of the device electrode 47 is electrically connected to the substrate electrode 48 via the sintering layer 25. The device electrode 47 may be located on a backside of the semiconductor die 30, i.e. on a side of the semiconductor die 30 which is placed in contact with the sintering layer 25. Vertical integrated semiconductor elements may have one of the device electrodes 45 arranged at the top side of the semiconductor die 30 and the other device electrode 47 may be arranged at the backside of the semiconductor die 30. The device electrode 45 may be contacted by a corresponding electrode (not shown in FIG. 4) of the pick and place tool 50 and be electrically connected to the current source 60 through it.

However, the semiconductor element 40 of the presently disclosed subject matter is not limited to vertical integrated semiconductor elements. The semiconductor element 40 may be a horizontally integrated semiconductor element in which case the at least two element electrodes may be both located on the top side of the semiconductor die 30.

The temperature sensitive parameter of the semiconductor element 40 is a physical parameter of the semiconductor element 40 and depends on the type of semiconductor element used.

For example, for a diode, the temperature sensitive parameter may be a forward direct voltage of the diode. The relationship of the forward direct voltage of a diode versus the temperature is well known. The forward direct voltage is typically dropping 2 mV per degree Celsius. By knowing this relationship the temperature can be extracted.

For an IGBT, the corresponding temperature sensitive parameter may be a collector emitter saturation voltage Vcesat. For a MOSFET, the corresponding temperature sensitive parameter may be a drain-source on voltage Vdson or a threshold voltage Vth.

Figure 5:
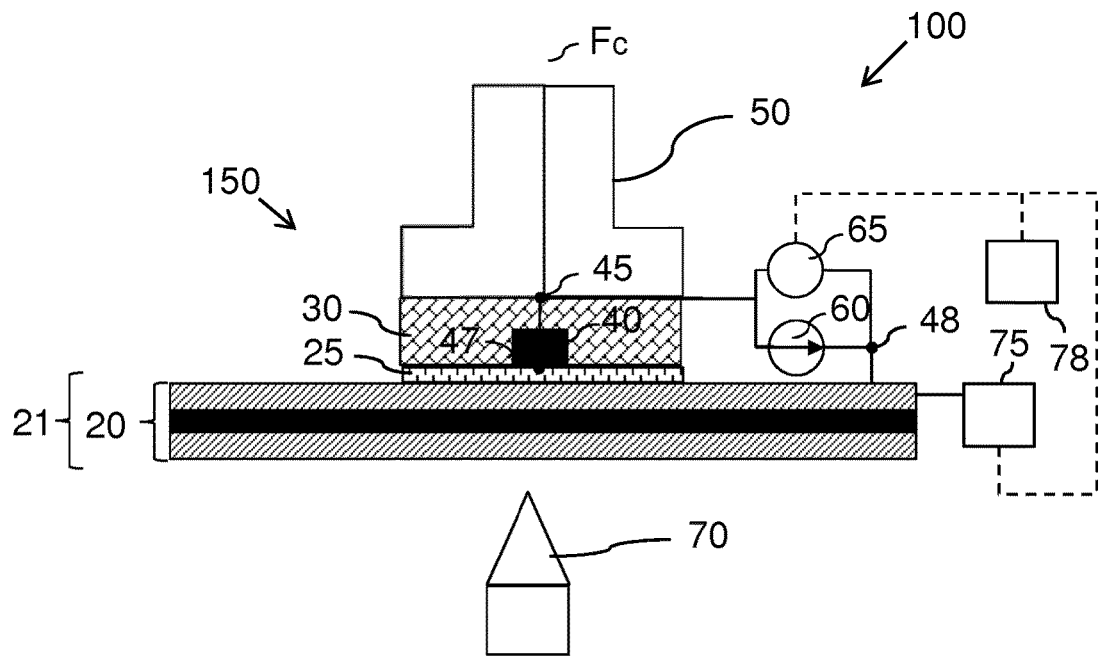

FIG. 5 schematically shows a first embodiment of a measurement system 100 for determining a sintering thermal impedance of a sintering layer 25.

The sintering layer 25 is disposed on a substrate 20 for bonding a semiconductor element 40 to the substrate 20. The substrate 20 has a predetermined substrate thermal impedance. The semiconductor element 40 includes at least two element electrodes 45 and 47 for measuring a temperature sensitive parameter of the semiconductor element 40. The semiconductor element 40 may be integrated in a semiconductor die 30 which is placed on the substrate 20 via pick and place tool 50.

The measurement system 100 includes a current source 60 for injecting an electrical current through the at least two element electrodes 45 and 47, a heat source 70 for heating the stack 21 for sintering the sintering layer 25 with a predetermined heat power, a first measurement device 65 configured to determine an element temperature from the temperature sensitive parameter, a second measurement device 75 configured to measure a stack temperature, and a processing device 78. The processing device 78 is configured to determine a stack thermal impedance by subtracting the element temperature from the stack temperature to obtain a temperature difference and dividing the temperature difference by the predetermined heat power. The processing device 78 is further configured to determine the sintering thermal impedance by subtracting the predetermined substrate thermal impedance from the stack thermal impedance.

As schematically shown in FIG. 5, the stack 21 is heated by the heat source 70 for sintering the sintering layer 25 with a predetermined heat power. Heating the stack 21 corresponds to method step 550 in flow diagram 500.

Optionally a compression force $F_c$ may be applied on the semiconductor die 30 by pick and place tool 50. With reference to FIG. 1, applying the compression force $F_c$ corresponds to optional method step 550 shown in flow diagram 500. The compression force $F_c$ has a vertical direction and maintains the semiconductor die 30 in place on the sintering layer 25 against the substrate 20. Predetermined heat power and a value of the compression force $F_c$ are controlled according to the desired sintering requirements. The heat source 70 may be a laser beam, or any other suitable heat source, for example an oven or a furnace. While the stack 21 is heated, a constant current is injected through the at least two device electrodes 45 and 47 of the semiconductor element 40.

While sintering, a temperature of the semiconductor element is determined from the measured temperature sensitive parameter. This corresponds to step 560 of flow diagram 500. For example, for a diode, the forward direct voltage may be monitored by the first measurement device 65, e.g. a voltmeter. From the measured forward direct voltage, the temperature of the semiconductor element 40 and therefore of the semiconductor die 30 is determined.

At the same time, the temperature of the stack 21 is measured, preferably in proximity of the substrate 20, for example at a top side or back side of the substrate 20. This corresponds to method step 565 in flow diagram 500. The temperature can for example be measured at the top side of the substrate 20 by a second measurement device 75, e.g. a thermocouple, or thermometer device.

A thermocouple is a material arrangement including two different materials, e.g. two wires made of different metals. A differential voltage appears between both materials, this is the so-called Seebeck effect. This differential voltage is proportional to the temperature. Thermocouples are common in many thermal systems for measuring the temperature locally inside the system. A thermocouple is usually measuring a volume temperature when it is inserted within a piece of material. A joint between the two different materials of the thermocouple is sensitive to the temperature. The joint is a sensing temperature electrode of the thermocouple and it is where the temperature is actually measured.

In the embodiment shown in FIG. 5, the stack 21 is directly heated from the bottom of the substrate 20 by the heat source 70.

When the second measurement device 75 is a thermocouple, its sensing temperature electrode may be thermally coupled to the substrate 20.

Once the element temperature is determined and the stack temperature is measured, a stack thermal impedance can be determined by the processing device 78.

Determining the stack thermal impedance 570 is shown in flow diagram 500. The stack thermal impedance is determined by subtracting the semiconductor element temperature from the stack temperature and dividing the result by the predetermined heat power. The following equation shows how the stack thermal impedance $Z_{th,s}$ is determined:

$$Z_{th,s} = \frac{T_s - T_{el}}{P_{heat}}, \quad (1)$$

where $Z_{th,s}$ is the stack thermal impedance, $T_s$ is the stack temperature, $T_{el}$ is the semiconductor element temperature and $P_{heat}$ is the predetermined heat power.

From the thermal impedance $Z_{th,s}$ of the stack 21, the sintering thermal impedance $Z_{th,sint}$ of the sintering layer 25 can be determined by subtracting the predetermined substrate thermal impedance from the stack thermal impedance:

$$Z_{th,sint} = Z_{th,s} - Z_{th,sub} \quad (2),$$

where $Z_{th,sub}$ is the predetermined substrate thermal impedance. Determining the sintering thermal impedance corresponds to method step 580 in flow diagram 500.

Figure 6:
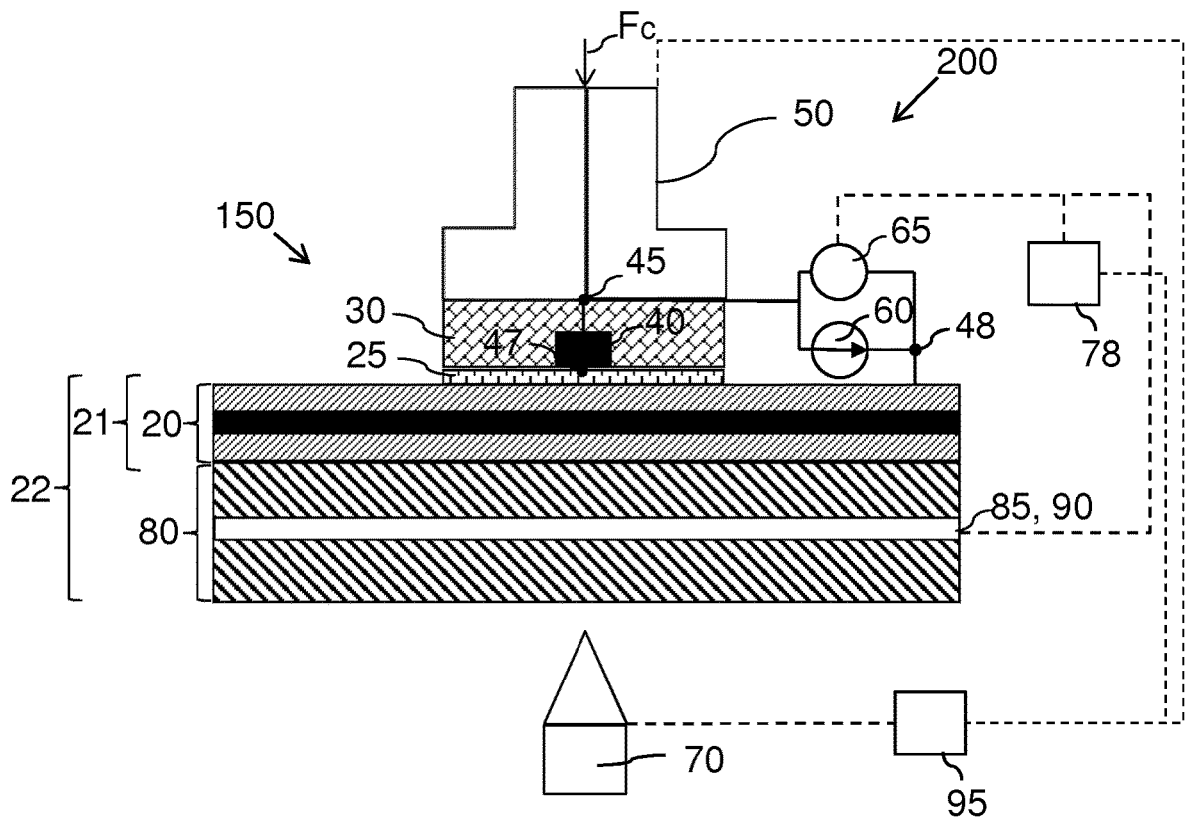

FIG. 6 schematically shows a second embodiment of a measurement system 200. Measurement system 200 differs from measurement system 100 in that measurement system 200 further includes a mechanical interface 80 for supporting the substrate 20 and a controller 95 for controlling the heat source 70 and optionally the pick and place tool 50.

The mechanical interface 80 is thermally coupled to the substrate 20.

In the measurement system 200, a stack 22 including the substrate 20, the sintering layer 25 and the mechanical interface 80 is formed.

The stack 22 is heated by the heat source 70 via the mechanical interface 80.

The mechanical interface 80 may be made of an electrically insulating and thermally conductive material, for example ceramic. However, other type of materials suitable for supporting the stack 22 and transferring heat between the heat source 70 and the stack 21 may be used.

The mechanical interface 80 provides mechanical support for the stack 21. The mechanical interface 80 provides thermal protection for the stack 21. With the mechanical interface 80 arranged at the bottom of the stack 21, the stack 21 and the substrate 20 are protected from direct heating by the heat source 70. The mechanical interface 80 may prevent heat from either deforming the stack 21 or modifying physical properties of the stack 21.

The mechanical interface 80 may have a gap 85 arranged therein in which a thermocouple 90 is arranged.

The sensing temperature electrode of the thermocouple 90 is thermally coupled to the substrate via the mechanical interface 80. Temperature of the stack 22 can be measured by the thermocouple 90.

The controller 95 is configured to stop heating the stack 22 when the sintering thermal impedance determined as described with reference to FIG. 6 and equation (2) has reached a predetermined value.

With reference to FIG. 5, the stack thermal impedance is the thermal impedance of the stack 21 which includes the thermal impedance of the substrate 20 and the thermal impedance of the sintering layer 25. The substrate 20 and the sintering layer 25 are thermally arranged in series. Hence the thermal impedance of the stack 21 is the sum of the thermal impedance of the substrate 20 and the thermal impedance of the sintering layer 25, respectively.

With reference to FIG. 6, the stack thermal impedance is the thermal impedance of the stack 22 which includes the thermal impedance of the substrate 20, the thermal impedance of the sintering layer 25 and the thermal impedance of the mechanical interface 80. The substrate 20, the sintering layer 25 and the mechanical interface 80 are thermally arranged in series. Hence the thermal impedance of the stack 22 is the sum of the thermal impedance of the mechanical interface 80, the thermal impedance of the substrate 20, and the thermal impedance of the sintering layer 25, respectively. However, the substrate 20 and the mechanical interface are both made of high thermally conductive materials. The predetermined substrate thermal impedance can in the embodiment shown in FIG. 6 be approximated to the sum of thermal impedance of the substrate 20 and the thermal impedance of the mechanical interface 80.

With the inventive method described, the thermal impedance of the sintering layer 25 can be determined. Further, better accuracy can be achieved with respect to the conventional art document US2010/0176098 which uses an optical method, because the inventive method determines the thermal impedance of the sintering layer 25 while conventional art US2010/0176098 can only determine a surface temperature of the semiconductor die.

With the inventive method, the thermal impedance of the sintering layer 25 is determined in the sintering layer 25 at a location corresponding to the location of the semiconductor element 40.

In the method described, the thermal impedance of the sintering layer 25 is determined while sintering is occurring.

The inventive method allows real-time monitoring of the evolution of the thermal impedance of the sintering layer 25 while thermal conductivity of the sintering layer increases while sintering is occurring. This effect cannot be reached by conventional art optical methods measuring only surface temperatures. These conventional art optical methods may only give an approximate measure of the temperature of the sintering layer at thermal equilibrium, i.e. when the sintering layer has already reached the desired temperature and thus with a substantial delay. The inventive method can thus better monitor the quality of the sintering during sintering. This is beneficial for a large number of applications where for example sintering is performed in two or more phases.

In a first phase a pre-sintering may be performed in which the heat source 70 heats the stack 21 or 22 and optionally the compression force $F_c$ is applied on the semiconductor die 30 for a predetermined period of time.

Heating the stack 21 or 22 may be stopped after the predetermined period of time. For example, heating the stack 20 or 21 and optionally applying the compression force $F_c$ may be stopped when the determined sintering thermal impedance has reached a predetermined value.

With reference to FIG. 6 the controller 95 may be coupled to the heat source 70, processing device 78 and optionally to the pick and place tool 50. The controller 75 may be configured to receive the sintering thermal impedance from the processing device 78 and to control the heat source 70 and the pick and place tool 50. The controller 95 may be configured for stopping heating the stack 20 and optionally stopping applying the compressing force $F_c$ on the semiconductor die 30 when the sintering thermal impedance has reached the predetermined value.

This predetermined value of the sintering thermal impedance should be sufficient to allow the semiconductor die 30 to withstand certain minimal pull and shear strength requirements such that the device can be handled during further assembly of the device.

For example, the predetermined value of the sintering thermal impedance may be 0.05° C. per watt or lower.

With reference to FIG. 1, heating the stack 550 may be performed until the predetermined value of the sintering thermal impedance is reached. When the sintering thermal impedance has reached the predetermined value, heating the stack may be stopped 590, e.g. by the controller 95 as shown in FIG. 6.

The predetermined value of the sintering thermal impedance may correspond to a first predetermined shear and/or pull strength of the semiconductor die. The first predetermined shear and/or pull strength of the semiconductor die may be minimal to guarantee sufficient bonding between the semiconductor die and the substrate.

Assembly of the device 150 may consist of several thermal cycles in which different parts are mounted or soldered in subsequent assembly phases. During these subsequent assembly phases the device is handled in the assembly line.

By performing pre-sintering in the first phase, i.e. by heating the stack until the predetermined value of the sintering thermal impedance is reached, thermal stress is limited to the amount to ensure that the minimal pull and shear strength requirements are satisfied.

The device is not thermally overstressed which improves lifetime of the device. Further, if the sintering thermal impedance cannot achieve the predetermined value, this may be an indication of a defective contact between the substrate 20 and the semiconductor die 30 or defective material of the sintering layer 25. In both cases the assembled device may be scrapped from the production line, avoiding that a defective device may be further handled during assembly. With the described method, assembly yield can thus be improved and costs of assembly decreased.

In a second phase, a full sintering may be performed. The second phase can be performed by heating the stack for obtaining a sintering thermal impedance value corresponding to a second predetermined shear and/or pull strength of the semiconductor die. The second predetermined shear and/or pull strength may be higher than the first predetermined shear and/or pull strength. The second predetermined shear and/or pull strength may be sufficiently high for final assembly requirements. In the second phase, heating the stack may be performed with the same heat source 70 which may be re-activated for an additional time period or by heating with a different heat source 70, for example with an oven or furnace.

Multiple semiconductor dice may be placed on the sintering layer 25.

For example, in an embodiment, the method of determining the sintering thermal impedance may further include placing a further semiconductor die on the sintering layer 25 or further sintering layer. The further semiconductor die may include a further semiconductor element which includes at least two corresponding further element electrodes for injecting a current therein and measuring a corresponding further temperature sensitive parameter of the further semiconductor element.

In this embodiment, while sintering, a further semiconductor element temperature can be determined from the further temperature sensitive parameter. The thermal impedance of the stack can be determined by subtracting the further semiconductor element temperature from the stack temperature to obtain a further temperature difference and dividing the further temperature difference by the predetermined heat power. Finally, the sintering thermal impedance of the sintering layer can be determined at a location corresponding to the further semiconductor element by subtracting the predetermined substrate thermal impedance from the stack thermal impedance.

The further semiconductor element may be integrated in the further semiconductor die.

In this way the sintering thermal impedance of the sintering layer may be determined at a location of multiple semiconductor dice. The yield of complex assembly technology where multiple semiconductor dice are bonded to the substrate can be improved.

In the claims, any reference signs placed between parentheses shall not be construed as limiting the claim. Use of the verb "include" and its conjugations does not exclude the presence of elements or steps other than those stated in a claim. The article "a" or "an" preceding an element does not exclude the presence of a plurality of such elements. The presently disclosed subject matter may be implemented by means of hardware including several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of determining a sintering thermal impedance of a sintering layer, the method comprising:
   providing a substrate having a predetermined substrate thermal impedance,
   disposing the sintering layer on the substrate, the substrate and the sintering layer forming a stack,
   placing at least one semiconductor die on the sintering layer, the semiconductor die having a semiconductor element which includes at least two element electrodes,
   injecting an electrical current through the at least two element electrodes for measuring a temperature sensitive parameter of the semiconductor element,
   heating the stack for sintering the sintering layer with a predetermined heat power,
   determining, while sintering, a semiconductor element temperature from the measured temperature sensitive parameter,
   measuring a stack temperature,
   determining a stack thermal impedance by subtracting the semiconductor element temperature from the stack temperature to obtain a temperature difference and dividing the temperature difference by the predetermined heat power, and
   determining the sintering thermal impedance by subtracting the predetermined substrate thermal impedance from the stack thermal impedance.

2. The method according to claim 1, wherein the substrate is at least partially electrically conductive and includes a substrate electrode, and wherein injecting the electrical current is performed via the substrate electrode by electrically coupling one of the element electrodes to the substrate electrode via the sintering layer.

3. The method according to claim 1, wherein while heating the stack, a compression force is applied on semiconductor die against the substrate.

4. The method according to claim 1, wherein measuring the stack temperature includes directly measuring a substrate temperature at a front side of the substrate where the sintering layer is disposed or at a back side of the substrate opposite to a front side of the substrate where the sintering layer is disposed.

5. The method according to claim 1, wherein measuring the stack temperature includes using a thermocouple having a sensing temperature electrode thermally coupled to the substrate.

6. The method according to claim 1, further including placing a further semiconductor die on the sintering layer, the further semiconductor die including a further semiconductor element including at least two corresponding further element electrodes for injecting a current therein and measuring a corresponding further temperature sensitive parameter of the further semiconductor element.

7. The method according to claim 6, further comprising:
   determining, while sintering, a further semiconductor element temperature from the measured further temperature sensitive parameter,
   determining a further stack thermal impedance by subtracting the further semiconductor element temperature from the stack temperature and dividing by the predetermined heat power, and
   determining the further sintering thermal impedance by subtracting the predetermined substrate thermal impedance from the further stack thermal impedance.

8. A measurement system for determining a sintering thermal impedance of a sintering layer, the sintering layer being disposed on a substrate for bonding a semiconductor die to the substrate, the semiconductor die including a semiconductor element, the sintering layer and the substrate forming a stack, the substrate having a predetermined substrate thermal impedance and the semiconductor element including at least two element electrodes, the measurement system including:
   a current source for injecting an electrical current through the at least two element electrodes for measuring a temperature sensitive parameter of the semiconductor element,
   a heat source for heating the stack for sintering the sintering layer with a predetermined heat power;
   a first measurement device configured to determine a semiconductor element temperature from the temperature sensitive parameter;
   a second measurement device configured to measure a stack temperature; and
   a processing device configured to:
      determine a stack thermal impedance by subtracting the semiconductor element temperature from the stack temperature to obtain a temperature difference and dividing the temperature difference by the predetermined heat power, and
      determine the sintering thermal impedance by subtracting the predetermined substrate thermal impedance from the stack thermal impedance.

9. The measurement system according to claim 8, further including a controller configured to stop heating the stack when the sintering thermal impedance has reached a predetermined value.

10. The measurement system according to claim 8, further including a mechanical interface for supporting the substrate, the mechanical interface being thermally coupled to the substrate.

11. The measurement system according to claim 8, wherein the substrate is at least partially electrically conductive and includes a substrate electrode, and wherein one of the device electrodes is electrically connected to the substrate electrode via the sintering layer.

12. The measurement system according to claim 8, wherein the semiconductor element is one of devices: diode, Bipolar Junction transistors, Insulated Gate Bipolar Transistor, Metal Oxide Semiconductor Field Effect Transistor device.

13. The measurement system according to claim 8, wherein the temperature sensitive parameter is one of parameters selected out of: a forward direct voltage, a saturation voltage, a turn on voltage, a threshold voltage.

* * * * *